US010504799B2

(12) United States Patent
Ando et al.

(10) Patent No.: US 10,504,799 B2
(45) Date of Patent: Dec. 10, 2019

(54) DISTINCT GATE STACKS FOR III-V-BASED CMOS CIRCUITS COMPRISING A CHANNEL CAP

(71) Applicant: INTERNATIONAL BUSINESS MACHINES CORPORATION, Armonk, NY (US)

(72) Inventors: Takashi Ando, Tuckahoe, NY (US); Martin M. Frank, Dobbs Ferry, NY (US); Renee T. Mo, Yorktown Heights, NY (US); Vijay Narayanan, New York, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/649,122

(22) Filed: Jul. 13, 2017

(65) Prior Publication Data
US 2017/0316979 A1 Nov. 2, 2017

Related U.S. Application Data

(62) Division of application No. 15/051,804, filed on Feb. 24, 2016.

(51) Int. Cl.
*H01L 21/8258* (2006.01)
*H01L 27/092* (2006.01)
(Continued)

(52) U.S. Cl.
CPC ...... *H01L 21/8258* (2013.01); *H01L 21/8238* (2013.01); *H01L 21/8252* (2013.01);
(Continued)

(58) Field of Classification Search
CPC ............ H01L 21/8258; H01L 21/8238; H01L 21/823807
See application file for complete search history.

(56) References Cited

U.S. PATENT DOCUMENTS

| 4,507,158 A | 3/1985 | Kamins et al. |
| 5,254,489 A | 10/1993 | Nakata |
| (Continued) | | |

FOREIGN PATENT DOCUMENTS

| CN | 101976667 B | 7/2012 |
| CN | 104299971 A | 1/2015 |

OTHER PUBLICATIONS

List of IBM Patents or Patent Applications Treated as Related dated Jul. 13, 2017, 2 pages.
(Continued)

*Primary Examiner* — Xia L Cross
(74) *Attorney, Agent, or Firm* — Tutunjian & Bitetto, P.C.; Vazken Alexanian

(57) ABSTRACT

Semiconductor devices and methods of forming the same include forming a first channel region on a first semiconductor region. A second channel region is formed on a second semiconductor region. The second semiconductor region is formed from a semiconductor material that is different from a semiconductor material of the first semiconductor region. A semiconductor cap is formed on one or more of the first and second channel regions. A gate dielectric layer is formed over the nitrogen-containing layer. A gate is formed on the gate dielectric.

10 Claims, 6 Drawing Sheets

(51) Int. Cl.
*H01L 21/8238* (2006.01)
*H01L 21/8252* (2006.01)
*H01L 29/267* (2006.01)
*H01L 29/66* (2006.01)
*H01L 29/10* (2006.01)
*H01L 29/51* (2006.01)

(52) U.S. Cl.
CPC ........... *H01L 21/823807* (2013.01); *H01L 21/823842* (2013.01); *H01L 21/823857* (2013.01); *H01L 27/092* (2013.01); *H01L 29/1054* (2013.01); *H01L 29/267* (2013.01); *H01L 29/66568* (2013.01); *H01L 29/517* (2013.01); *H01L 29/518* (2013.01)

(56) References Cited

U.S. PATENT DOCUMENTS

| | | | |
|---|---|---|---|
| 5,384,473 | A | 1/1995 | Yoshikawa et al. |
| 5,596,218 | A | 1/1997 | Soleimani et al. |
| 5,674,788 | A | 10/1997 | Wristers et al. |
| 5,763,922 | A * | 6/1998 | Chau ............... H01L 27/0922 257/371 |
| 6,093,661 | A | 7/2000 | Trivedi et al. |
| 6,171,936 | B1 | 1/2001 | Fitzgerald |
| 6,180,465 | B1 * | 1/2001 | Gardner ............ H01L 21/28194 257/E21.429 |
| 6,436,771 | B1 | 8/2002 | Jang et al. |
| 6,566,281 | B1 | 5/2003 | Buchanan et al. |
| 6,756,635 | B2 | 6/2004 | Yasuda et al. |
| 6,821,833 | B1 | 11/2004 | Chou et al. |
| 6,949,479 | B2 | 9/2005 | Wang |
| 7,001,810 | B2 | 2/2006 | Dong et al. |
| 7,138,691 | B2 | 11/2006 | Burnham et al. |
| 7,179,754 | B2 | 2/2007 | Kraus et al. |
| 7,329,923 | B2 | 2/2008 | Doris et al. |
| 7,381,619 | B2 | 6/2008 | Wang et al. |
| 7,388,278 | B2 | 6/2008 | Holt et al. |
| 7,439,542 | B2 | 10/2008 | Yang |
| 7,514,373 | B2 | 4/2009 | Kraus et al. |
| 7,626,246 | B2 | 12/2009 | Lochtefeld et al. |
| 7,741,167 | B2 | 6/2010 | Beyer et al. |
| 7,834,456 | B2 | 11/2010 | Tabatabaie et al. |
| 7,872,317 | B2 | 1/2011 | Callegari et al. |
| 8,021,990 | B2 | 9/2011 | Rotondaro et al. |
| 8,053,304 | B2 | 11/2011 | Ko |
| 8,237,247 | B2 | 8/2012 | Kim et al. |
| 8,293,599 | B2 | 10/2012 | Na et al. |
| 8,324,090 | B2 | 12/2012 | Masuoka et al. |
| 8,383,483 | B2 | 2/2013 | Arnold et al. |
| 8,404,544 | B1 | 3/2013 | Yin et al. |
| 8,432,002 | B2 | 4/2013 | Haran et al. |
| 8,610,172 | B2 | 12/2013 | Guo et al. |
| 8,652,908 | B2 | 2/2014 | Kim et al. |
| 8,669,155 | B2 | 3/2014 | Yin et al. |
| 8,841,177 | B2 | 9/2014 | Chen et al. |
| 8,871,615 | B2 | 10/2014 | Mori |
| 8,890,264 | B2 | 11/2014 | Dewey et al. |
| 8,975,635 | B2 | 3/2015 | Chen et al. |
| 9,355,917 | B2 | 5/2016 | Lee et al. |
| 9,461,034 | B2 | 10/2016 | Pan et al. |
| 9,780,174 | B2 | 10/2017 | Lee et al. |
| 9,799,767 | B2 | 10/2017 | Jacob |
| 2002/0024094 | A1 | 2/2002 | Gao et al. |
| 2002/0185693 | A1 * | 12/2002 | Yasuda ............ H01L 21/28176 257/392 |
| 2002/0190268 | A1 | 12/2002 | Wang |
| 2003/0102490 | A1 | 6/2003 | Kubo et al. |
| 2004/0256700 | A1 | 12/2004 | Doris et al. |
| 2005/0093104 | A1 | 5/2005 | Ieong et al. |
| 2006/0113605 | A1 * | 6/2006 | Currie ............ H01L 21/823807 257/368 |
| 2006/0244069 | A1 | 11/2006 | Wieczorek et al. |
| 2006/0289895 | A1 | 12/2006 | Kamata |
| 2007/0138563 | A1 | 6/2007 | Callegari et al. |
| 2007/0145481 | A1 | 6/2007 | Tilke et al. |
| 2007/0181977 | A1 | 8/2007 | Lochtefeld et al. |
| 2007/0252216 | A1 | 11/2007 | Muhammad |
| 2008/0132018 | A1 | 6/2008 | Wang et al. |
| 2008/0142910 | A1 | 6/2008 | Oh |
| 2008/0179636 | A1 | 7/2008 | Chidambarrao et al. |
| 2009/0042344 | A1 * | 2/2009 | Ye ................ H01L 29/66462 438/172 |
| 2009/0095981 | A1 | 4/2009 | Kang et al. |
| 2009/0224369 | A1 | 9/2009 | Gamble et al. |
| 2009/0243031 | A1 | 10/2009 | Natzle et al. |
| 2009/0289306 | A1 | 11/2009 | Watanabe et al. |
| 2009/0321794 | A1 | 12/2009 | Kim et al. |
| 2010/0258881 | A1 | 10/2010 | Chudzik et al. |
| 2010/0304548 | A1 | 12/2010 | Turner et al. |
| 2012/0083089 | A1 * | 4/2012 | Kim ............... H01L 21/28506 438/301 |
| 2012/0108026 | A1 * | 5/2012 | Nieh ............... H01L 21/823807 438/300 |
| 2012/0129330 | A1 * | 5/2012 | Kim ............... H01L 21/28176 438/591 |
| 2012/0248503 | A1 | 10/2012 | Huo et al. |
| 2012/0319170 | A1 | 12/2012 | Hata et al. |
| 2013/0032860 | A1 | 2/2013 | Marino et al. |
| 2013/0105859 | A1 | 5/2013 | Wang et al. |
| 2013/0153964 | A1 * | 6/2013 | Guo ............... H01L 21/8258 257/192 |
| 2013/0161698 | A1 | 6/2013 | Marino et al. |
| 2013/0200442 | A1 | 8/2013 | Lin et al. |
| 2013/0264609 | A1 | 10/2013 | Di et al. |
| 2013/0270512 | A1 | 10/2013 | Radosavljevic et al. |
| 2013/0277765 | A1 * | 10/2013 | Chudzik ............ H01L 29/47 257/411 |
| 2014/0017859 | A1 | 1/2014 | Cheng et al. |
| 2014/0084387 | A1 | 3/2014 | Dewey et al. |
| 2014/0131770 | A1 | 5/2014 | Chen et al. |
| 2014/0134811 | A1 * | 5/2014 | Chen ............... H01L 21/02381 438/212 |
| 2014/0217467 | A1 * | 8/2014 | Pawlak ............ H01L 29/12 257/183 |
| 2014/0264362 | A1 | 9/2014 | Chen et al. |
| 2015/0021688 | A1 | 1/2015 | Sung et al. |
| 2015/0021696 | A1 | 1/2015 | Sung et al. |
| 2015/0024601 | A1 | 1/2015 | Zhou et al. |
| 2015/0035055 | A1 | 2/2015 | Wang |
| 2015/0048417 | A1 | 2/2015 | Kwok et al. |
| 2015/0061024 | A1 | 3/2015 | Li et al. |
| 2015/0072498 | A1 | 3/2015 | Dewey et al. |
| 2016/0035896 | A1 * | 2/2016 | Yamazaki ........ H01L 29/7869 257/43 |
| 2017/0141227 | A1 | 5/2017 | Jacob |
| 2017/0243789 | A1 | 8/2017 | Ando et al. |
| 2017/0243867 | A1 | 8/2017 | Ando et al. |

OTHER PUBLICATIONS

"List of IBM Patents or Patent Applications Treated as Related".
Takagi et al., III-V/Ge channel MOS device technologies in nano CMOS era, Japanese Journal of Applied Physics, 54, 06FA01, 2015, 19 pages.
Takagi et al., III-V/Ge CMOS technologies on Si platform, Symposium on VLSI Technology Digest of Technical Papers, IEEE, 2010, pp. 147-148.
Office Action Issued in U.S. Appl. No. 15/051,790 dated Jun. 2, 2017, pp. 1-15.
Office Action issued in U.S. Appl. No. 15/615,245 dated Dec. 15, 2017, 17 pages.
Office Action issued in U.S. Appl. No. 15/649,182 dated Aug. 24, 2017, pp. 1-44.
K. Cheng et al., "High performance extremely thin SOI (ETSOI) hybrid CMOS with Si channel NFET and strained SiGe channel PFET," 2012 International Electron Devices Meeting, San Francisco, CA, Dec. 2012.
L. Czornomaz et al., "First demonstration of InGaAs/SiGe CMOS inverters and dense SRAM arrays on Si using selective epitaxy and

(56) References Cited

OTHER PUBLICATIONS standard FEOL processes," 2016 IEEE Symposium on VLSI Technology, Honolulu, HI, Jun. 2016.
M. Yokoyama et al., "CMOS integration of InGaAs nMOSFETs and Ge pMOSFETs with self-align Ni-based metal S/D using direct wafer bonding," 2011 Symposium on VLSI Technology—Digest of Technical Papers, Honolulu, HI, Jun. 2011.
Notice of Allowance for U.S. Appl. No. 15/051,790 dated Apr. 12, 2018 (10 pages).
Office Action for U.S. Appl. No. 15/649,182 dated Apr. 4, 2018 (26 pages).
Non Final Office Action for U.S. Appl. No. 16/012,032 dated Sep. 21, 2018 (36 pages).
Non Final Rejection for U.S. Appl. No. 15/649,182 dated Nov. 16, 2018 (33 pages).
U.S. Office Action issued in U.S. Appl. No. 16/012,032 dated Jan. 7, 2019, 39 pages.
Non Final Rejection for U.S. Appl. No. 15/649,182 dated Sep. 6, 2019 (30 pages).

\* cited by examiner

DISTINCT GATE STACKS FOR III-V-BASED CMOS CIRCUITS COMPRISING A CHANNEL CAP

BACKGROUND

Technical Field

The present invention relates to semiconductor devices and, more particularly, to the use of III-V-type and IV-type semiconductor devices on a single chip.

Description of the Related Art

III-V compound semiconductors, such as gallium arsenide, indium gallium arsenide, indium arsenide, and indium antimonide, may be used in transistor devices using complementary metal oxide semiconductor (CMOS) processes. While such devices have been shown, it is challenging to form III-V-based devices on the same chip as IV-based devices.

One challenge arises due to the relative volatility of III-V semiconductors. Whereas IV-type semiconductors (such as, e.g., silicon and silicon germanium) are stable at high temperatures, III-V-type semiconductors may be damaged by high-temperature processes that conventional semiconductors would withstand.

One conventional approach is to use stacked, three-dimensional CMOS devices, with n-type field effect transistors (FETs) and p-type FETs on separate layers. Such approaches can provide III-V-based devices and IV-based devices on the respective layers, but the cost may be prohibitively high and it can be difficult to achieve high performance and reliability due to the complicated fabrication processes.

Another conventional approach uses IV-based p-type FETs and III-V-based n-type FETs on a given chip, but with the same gate dielectric for each. This does not provide the ability to separately optimize the gate stack properties (such as, e.g., leakage, threshold voltage, performance, reliability, etc.) of each device type.

SUMMARY

A method for forming a plurality of semiconductor devices includes forming a first channel region on a first semiconductor region. A second channel region is formed on a second semiconductor region. The second semiconductor region is formed from a semiconductor material that is different from a semiconductor material of the first semiconductor region. A semiconductor cap is formed on one or more of the first and second channel regions. A gate dielectric layer is formed over the nitrogen-containing layer. A gate is formed on the gate dielectric.

A method for forming a plurality of semiconductor devices includes forming a first channel region on a first semiconductor region formed from a group IV semiconductor material. A second channel region is formed on a second semiconductor region coplanar with the first semiconductor region. The second semiconductor region is formed from a III-V semiconductor material. A silicon cap is formed on one or more of the first and second channel regions. A gate dielectric layer is formed over the nitrogen-containing layer. A gate is formed on the gate dielectric.

A semiconductor device includes a first channel region formed from a first semiconductor material. A second channel region is formed from a second semiconductor material, different from the first semiconductor material. A nitrogen-containing layer is formed on one or more of the first and second channel regions. A gate is formed over the nitrogen-containing layer.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Embodiments of the present invention provide III-V-based devices and IV-based devices on the same chip using complementary metal oxide semiconductor (CMOS) processes. The present embodiments provide distinct gate stacks between the types of devices, either with all devices having a same channel capping layer and differing gate dielectric and gate materials, with one device type having the channel capping layer and all devices having same gate dielectric and gate materials, or with one device having the channel capping layer and with the devices having differing gate dielectric and gate materials.

The most common type of semiconductor devices are based on group IV semiconductors. These semiconductors include, e.g., silicon (including polysilicon, epitaxially grown silicon, and amorphous silicon), germanium, silicon germanium, silicon carbide, and layers thereof. In addition, semiconductor devices may be formed using composite III-V semiconductors, which use one or more elements from group III on the periodic table and one or more elements from group V.

Typically, the III-V compound semiconductors are binary, ternary or quaternary alloys including III/V elements. Examples of III-V compound semiconductors that can be used in the present embodiments include, but are not limited to aluminum antimonide, aluminum arsenide, aluminum nitride, aluminum phosphide, gallium arsenide, gallium phosphide, indium antimonide, indium arsenic, indium nitride, indium phosphide, aluminum gallium arsenide, indium gallium phosphide, aluminum indium arsenic, aluminum indium antimonide, gallium arsenide nitride, gallium arsenide antimonide, aluminum gallium nitride, aluminum gallium phosphide, indium gallium nitride, indium arsenide antimonide, indium gallium antimonide, aluminum gallium indium phosphide, aluminum gallium arsenide phosphide, indium gallium arsenide phosphide, indium arsenide antimonide phosphide, aluminum indium arsenide phosphide, aluminum gallium arsenide nitride, indium gallium arsenide nitride, indium aluminum arsenide nitride, gallium arsenide antimonide nitride, gallium indium nitride arsenide aluminum antimonide, gallium indium arsenide antimonide phosphide, and combinations thereof.

The use of III-V semiconductors may be advantageous for some purposes, as they provide greater freedom to the circuit designer in selecting the particular device properties desired for an application. However, while the processes for fabricating devices based on group IV semiconductors are well developed, with many existing fabrication plants using such processes, the processes for fabricating III-V-based devices are relatively immature. The present embodiments therefore integrate both types of device on a single chip to take advantage of existing IV-type processes.

Figure 1:
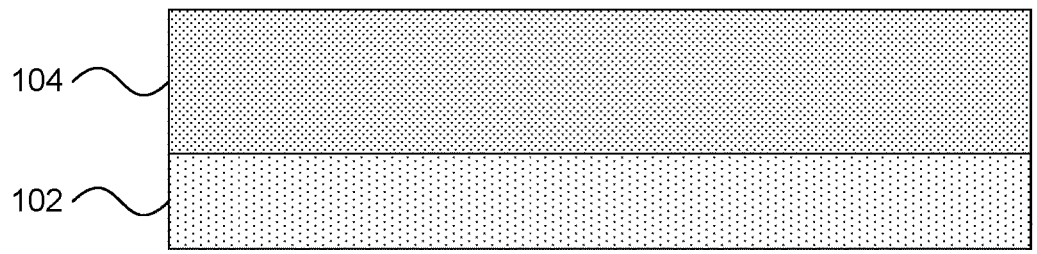
FIG. 1 is a cross-sectional diagram of a step in forming a plurality of semiconductor devices in accordance with the present principles.

Referring now to the drawings in which like numerals represent the same or similar elements and initially to FIG. 1, a step in fabricating a set of field effect transistors is shown. A substrate is shown that includes an insulator layer 102 and a semiconductor layer 104. This embodiment specifically contemplates a semiconductor-on-insulator (SOI) substrate structure, it should be understood that other types of substrate, such as a bulk semiconductor substrate, may be used instead.

Referring now to the drawings in which like numerals represent the same or similar elements and initially to FIG. 1, a step in fabricating a set of field effect transistors is shown. A substrate is shown that includes an insulator layer 102 and a semiconductor layer 104. This embodiment specifically contemplates a semiconductor-on-insulator (SOI) substrate structure, it should be understood that other types of substrate, such as a bulk semiconductor substrate, may be used instead.

The insulator layer 102 may be any appropriate insulator or dielectric material. In specific embodiment the insulator layer 102 may be silicon dioxide, but other examples include a glass layer, a polyimide layer, a diamond-like carbon layer, etc. The semiconductor layer is specifically contemplated to be a group IV semiconductor, such as silicon germanium. It should be recognized that any appropriate group IV semiconductor may be employed, with examples including silicon (polysilicon, epitaxially grown silicon, or amorphous silicon), germanium, silicon carbide, and layers thereof. In an alternative embodiment, the semiconductor layer 104 may be a III-V semiconductor material, with indium gallium arsenide being specifically contemplated.

Figure 2:
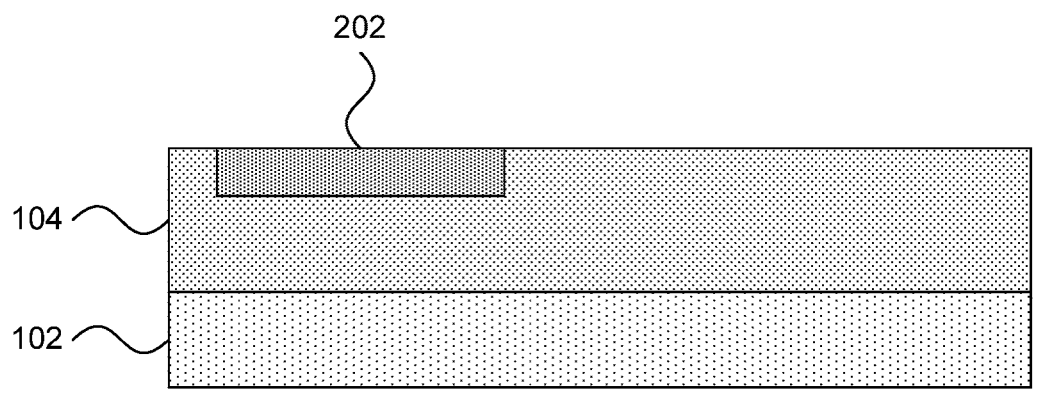
FIG. 2 is a cross-sectional diagram of a step in forming a plurality of semiconductor devices in accordance with the present principles.

Referring now to FIG. 2, a step in fabricating a set of field effect transistors is shown. A region 202 of contrasting semiconductor material is formed. In one particular embodiment, it is contemplated that a trench may be formed in the semiconductor layer 104 and the contrasting semiconductor region 202 may be grown or otherwise deposited in the trench. In another embodiment, the contrasting semiconductor region 202 may be grown or otherwise deposited on the top surface of the semiconductor layer 104. The formation of the contrasting semiconductor region 202 may be performed using, e.g., epitaxial growth.

The terms "epitaxial growth and/or deposition" means the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

In a first embodiment, the semiconductor layer 104 is a group IV semiconductor, such as silicon germanium, and the contrasting semiconductor region is a III-V semiconductor, such as indium gallium arsenide. In an alternative embodiment, the semiconductor layer 104 is the III-V semiconductor and the contrasting semiconductor region 202 is the group IV semiconductor. In either case, both types of semiconductor are present on the same chip.

Although the present embodiments are described with a second channel region being formed in the substrate semiconductor layer 104 itself, an alternative embodiment may have a second contrasting semiconductor region deposited on or in the substrate semiconductor layer 104. In such an embodiment, the substrate semiconductor layer 104 may be, for example, silicon, while the second contrasting semiconductor region may be, for example, silicon germanium or some other group IV semiconductor.

Figure 3:
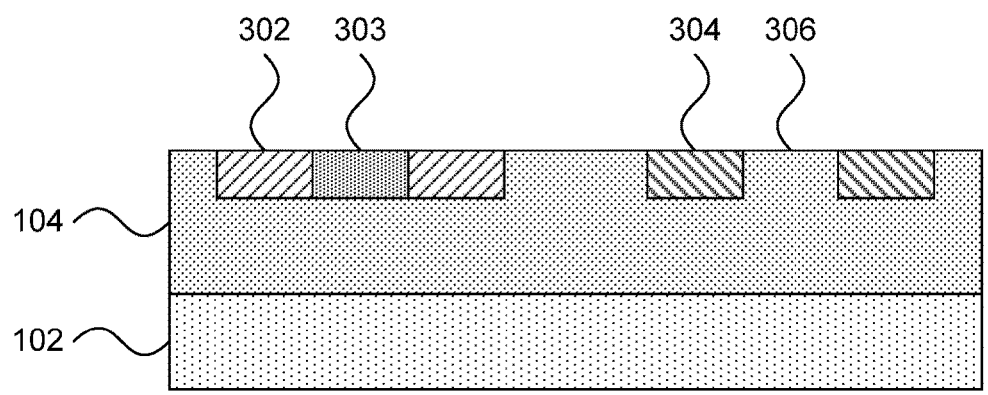
FIG. 3 is a cross-sectional diagram of a step in forming a plurality of semiconductor devices in accordance with the present principles.

Referring now to FIG. 3, a step in fabricating a set of field effect transistors is shown. Doped source/drain regions 302 are formed in the contrasting semiconductor region 202. Additional doped source/drain regions 304 are formed elsewhere on the semiconductor layer 104. The first set of doped source/drain regions 302 on the contrasting semiconductor region 202 establish a first channel region 303 between them, while the second set of doped source/drain regions 304 on the semiconductor layer 104 define a second channel region 306 between them. Notably the first and second channel regions 303/306 are coplanar with one another, defined herein to mean within about 20 nm of vertical displacement with respect to one another.

The source/drain regions 302 and 304 can be formed by any appropriate process. In one particular example, a dummy gate may be formed to define the channel regions 303 and 306, with dopant implantation being performed at the sides of the dummy gate. The dummy gate may subsequently be removed to form the actual gates, as is discussed in greater detail below. It should be noted that the depicted structure of the source/drain regions 302 and 304 is meant to be illustrative and should not be construed as limiting—any structure for the source/drain regions 302/304, including raised source drain regions, merged source/drain regions, fin source/drain regions, etc. may be used.

It is specifically contemplated that the first source/drain regions 302 and the second source/drain regions 304 may have different respective dopant types. In particular, it is contemplated that one set of regions will be p-type and the other will be n-type. In one particular embodiment, it is contemplated that the group IV semiconductor source/drain regions will be p-type doped, while the III-V semiconductor source/drain regions will be n-type doped.

The dopant atoms in the respective source/drain regions 302 and 304 may be an n-type dopant (i.e., an element from Group IV or VI of the Periodic Table of Elements) or a p-type dopant (i.e., an element from Group II or VI of the Periodic Table of Elements). Exemplary n-type dopants for a group IV semiconductor include phosphorus, arsenic and antimony. Exemplary p-type dopants for a group IV semiconductor include boron, aluminum, and gallium. Exemplary n-type dopants for a III-V semiconductor include selenium, tellurium, silicon, and germanium. Exemplary p-type dopants for a III-V semiconductor include beryllium, zinc, cadmium, silicon, and germanium. The concentration of dopant within the doped region is typically from about 1011 to about 1015 atoms/cm2, with a concentration of dopant within the doped region from about 1011 to about 1013 atoms/cm2 being more typical. The source/drain regions 302 and 304 may be doped through an implantation process or may, alternatively, be grown on the underlying layer and doped in situ.

To this point, each of the present embodiments share the same structure and process. The present embodiments diverge, however, regarding the application of a silicon cap over the channels 303 and 306. In one embodiment, a semiconductor cap is formed over both channels, and in a second embodiment, the semiconductor cap is formed over only one type of device.

Figure 4:
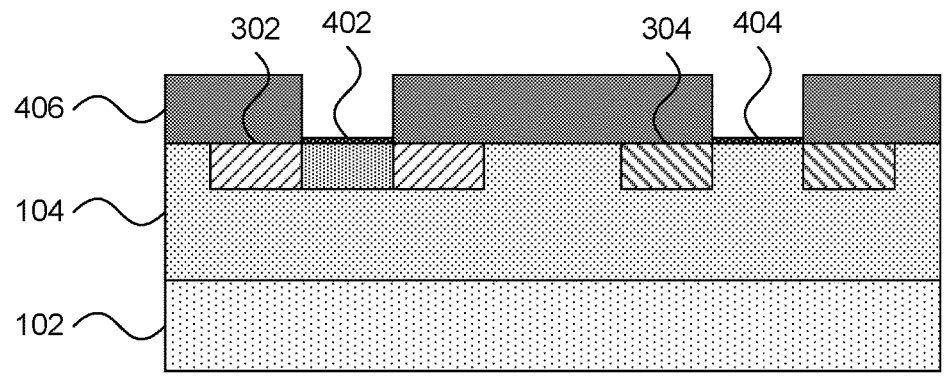
FIG. 4 is a cross-sectional diagram of a step in forming a plurality of semiconductor devices in accordance with the present principles.

Referring now to FIG. 4, a step in fabricating a set of field effect transistors is shown. The surfaces may be cleaned with a compatible wet clean to remove, e.g., adventitious contaminants (organics, metals, particles, etc.). The wet clean removes any native oxides that may have formed on the surfaces that would result in poorly controlled thickness and composition of the gate dielectrics. The wet clean may include application of dilute hydrofluoric acid, followed by hydrochloric acid for indium gallium arsenide and silicon germanium channels. Respective semiconductor layers 402 and 404 are formed on a top surface of both the semiconductor channel 306 and the contrasting semiconductor channel 303. It is specifically contemplated that the semiconductor layers 402/404 may be formed from silicon, but any appropriate semiconductor capping material may be used. In particular, the semiconductor layers 402/404 may be formed from, e.g., amorphous, epitaxial, crystalline, or polycrystalline silicon, may include hydrogen, may be partially or completely oxidized or nitride, and may be formed from multilayers of any of the above. The semiconductor layers 402/404 may be formed using any appropriate deposition process. In one embodiment, mask 406 is deposited over the device, with gaps over the semiconductor channel 306 and the contrasting semiconductor channel 303, to limit the deposition of the semiconductor layers 402/404 to only the channel areas.

The mask 406 may be formed by any appropriate dielectric or insulator material, such as a hardmask material or bulk dielectric. Materials for the mask 406 may include, e.g., silicon dioxide or silicon nitride. It should be understood that the mask 406 may have any appropriate shape, leaving areas other than just the channels 303 and 306 uncovered. In an alternative embodiment, the mask 406 may be omitted entirely, with the nitrogen-containing region being formed on arbitrary regions and later being removed as needed.

Exemplary deposition processes for the semiconductor layers include, for example, chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Figure 5:
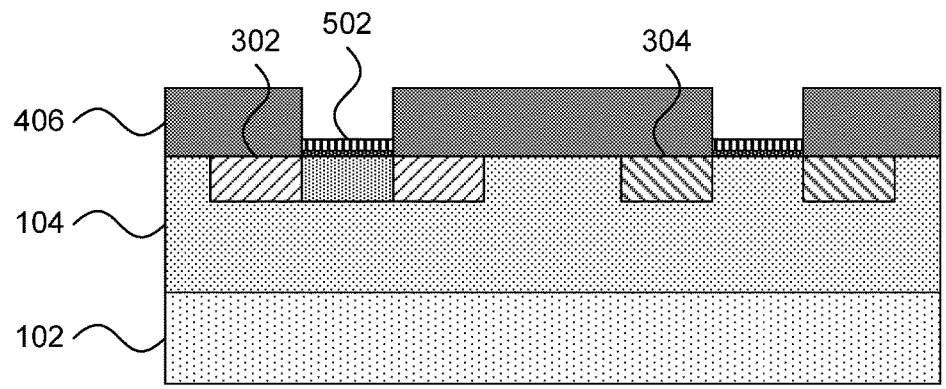
FIG. 5 is a cross-sectional diagram of a step in forming a plurality of semiconductor devices in accordance with the present principles.

Referring now to FIG. 5, a step in fabricating a set of field effect transistors is shown. A gate dielectric layer 502 is deposited over the semiconductor layers 402/404 using a high-k dielectric material. In general, a "high-k" dielectric material is one that has a dielectric constant k that is higher than the dielectric constant of silicon dioxide (e.g., greater than about 3.9) at room temperature and atmospheric pressure. In one embodiment, the least one gate dielectric layer is composed of a high-k oxide such as, for example, hafnium dioxide, zirconium dioxide, aluminum oxide, titanium dioxide, lanthanum oxide, strontium titanium oxide, lanthanum aluminum oxide, yttrium oxide, and mixtures thereof. Other examples of high-k dielectric materials for the at least one gate dielectric layer include hafnium silicate, hafnium silicon oxynitride or combinations thereof. Formation of the gate dielectric layer 502 may include an optional activation step for nucleation on the semiconductor layers 402/404. Activation improves subsequent nucleation of the high-k material during ALD, resulting in better film continuity and improved gate leakage characteristics. Activation may include treatment of the surface with, e.g., ozone.

Optionally, a nitrogen-containing layer may be applied to the gate dielectric layer 502 to form a nitrided gate dielectric layer. The nitrogen-containing layer may be applied before or after the gate dielectric layer 502 is deposited and annealed to combine the nitrogen-containing material with the high-k dielectric material. The nitrogen-containing layer may be formed using, e.g., an ammonia anneal, nitrogen plasma, etc.

Figure 6:
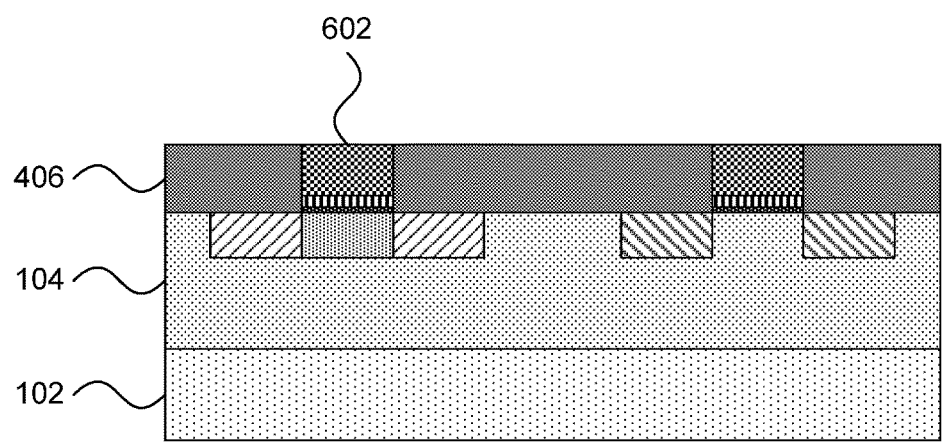
FIG. 6 is a cross-sectional diagram of a step in forming a plurality of semiconductor devices in accordance with the present principles.

Referring now to FIG. 6, a step in fabricating a set of field effect transistors is shown. A gate metal 602 is deposited over the gate dielectric layer 502. The gate metal 602 may be any appropriate conducting metal including, but not limited to, tungsten, nickel, titanium, molybdenum, tantalum, copper, platinum, silver, gold, rubidium, iridium, rhodium, rhenium, and alloys that include at least one of the aforementioned conductive elemental metals. The gate material may alternatively include nitrides or carbides in alloys with the gate metal. The gate metal 602 may also include layers of, e.g., elemental aluminum or tungsten above the alloy layers.

Figure 7:
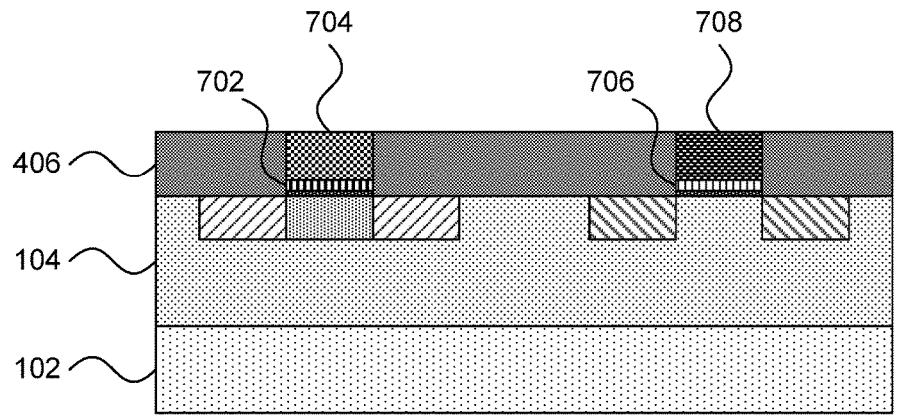
FIG. 7 is a cross-sectional diagram of a step in forming a plurality of semiconductor devices in accordance with the present principles.

Referring now to FIG. 7, an alternative step in fabricating a set of field effect transistors is shown. In this embodiment, the two devices have different high-k gate dielectric materials 702 and 706 and different gate metal materials 704 and 708. This may be used to provide a dual gate stack, with different devices having markedly different properties tailored to their particular applications.

Figure 8:
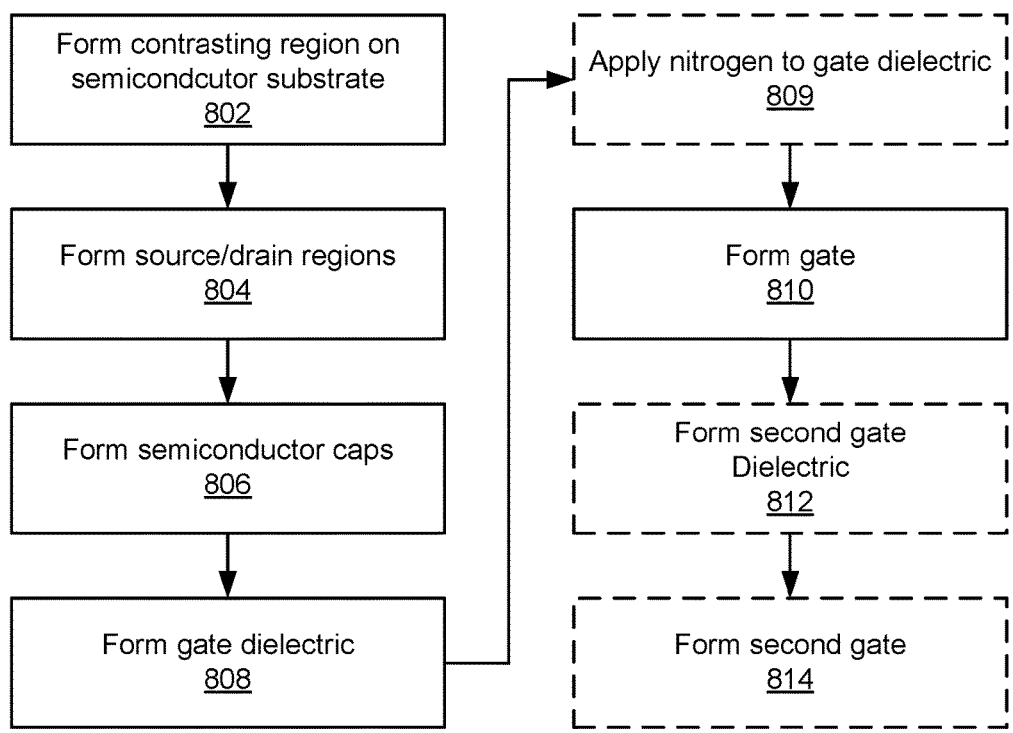
FIG. 8 is a block/flow diagram of a method of forming a plurality of semiconductor devices in accordance with the present principles.

Referring now to FIG. 8, a method of forming a set of field effect transistors is shown. Block 802 forms the contrasting semiconductor region 202 on a semiconductor layer 104, with one of the two semiconductor materials being a group IV semiconductor and the other being a III-V semiconductor. Block 804 forms source and drain regions 302 in the contrasting region 202, defining a contrasting semiconductor channel 303, as well as source and drain regions 304 in the semiconductor layer 104, defining the semiconductor channel 306.

Block 806 forms nitrogen-containing regions 402 and 404 on the respective contrasting channel regions 303 and 306. Block 806 may perform any appropriate blocking or masking needed to accomplish this, in one exemplary embodiment creating dummy gates, filling in a dielectric layer 406, and then removing the dummy gates. Block 806 then performs, for example, an ammonia anneal or nitrogen plasma treatment to create a layer of nitrogen-containing material on the surface of the channels 303/306. Block 808 deposits the gate dielectric 502 over the nitrogen-containing layers 402/404 and block 810 forms a gate 602 over the gate dielectric 502.

In an optional embodiment, the gate dielectric and gate materials may be different in different devices, according to the design needs of the devices. In this case, blocks 808 and 810 form the first gate dielectric 702 and first gate 704, while blocks 812 and 814 form a second gate dielectric 706 and gate 708 respectively.

It is to be understood that the present invention will be described in terms of a given illustrative architecture having a wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 9:
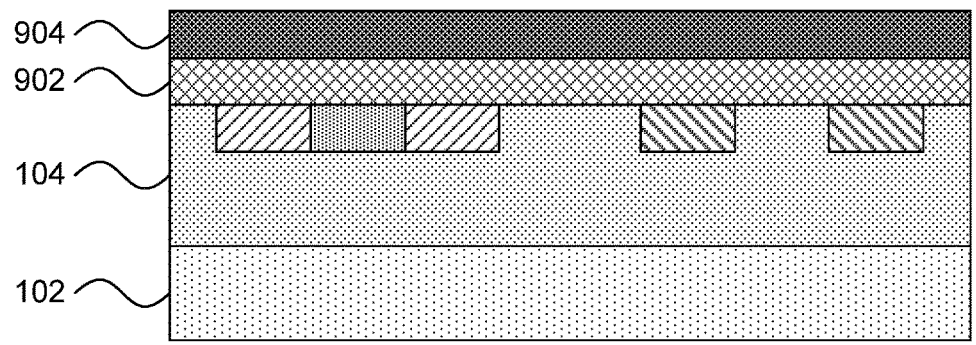
FIG. 9 is a cross-sectional diagram of an alternative step in forming a plurality of semiconductor devices in accordance with the present principles.

Referring now to FIG. 9, a step in fabricating an alternative embodiment of a set of field effect transistors is shown. The surfaces may be cleaned with a compatible wet clean to remove, e.g., adventitious contaminants (organics, metals, particles, etc.). The wet clean removes any native oxides that may have formed on the surfaces that would result in poorly controlled thickness and composition of the gate dielectrics.

This embodiment produces a nitrogen-containing layer on only one of the devices and branches off of FIG. 3 above, depositing a two-layer mask over the surface. The mask includes a first masking layer 902 and a second masking layer 904 that have etch selectivity with respect to one another. In one particular example, the first masking layer 902 is formed from an aluminum oxide while the second masking layer 904 is formed from a silicon dioxide layer. In alternative embodiments, only one masking layer may be used or the layers may be formed from alternative materials such as, e.g., silicon or germanium. The materials are selected for wet-chemical etch compatibility. The two masking layers 902/904 may be deposited by any appropriate process including, e.g., CVD, PVD, ALD, and GCIB deposition.

Figure 10:
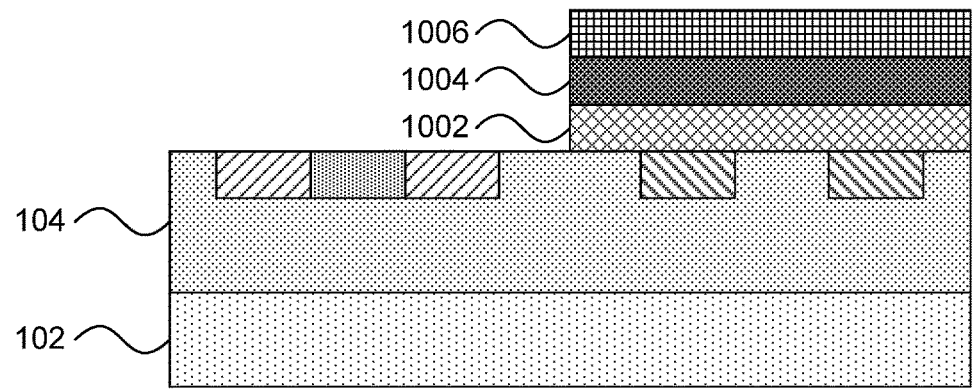
FIG. 10 is a cross-sectional diagram of an alternative step in forming a plurality of semiconductor devices in accordance with the present principles.

Referring now to FIG. 10, a step in fabricating an alternative embodiment of a set of field effect transistors is shown. A photoresist 1006 is used to cover one of the device regions (in this case, the III-V device) while the masking layers 902 and 904 are etched away in the area above the III-V type region, leaving etched masking layers 1002 and 1004. Notably, while the mask is shown as covering the group IV region and exposing the contrasting region (e.g., the type III-V semiconductor), it should be understood that the mask may instead be removed over the group IV region. The etch may be performed using an anisotropic etch, such as a reactive ion etch (RIE) with a subsequent application of a buffered oxide etch to clean residues from the exposed surface.

Figure 11:
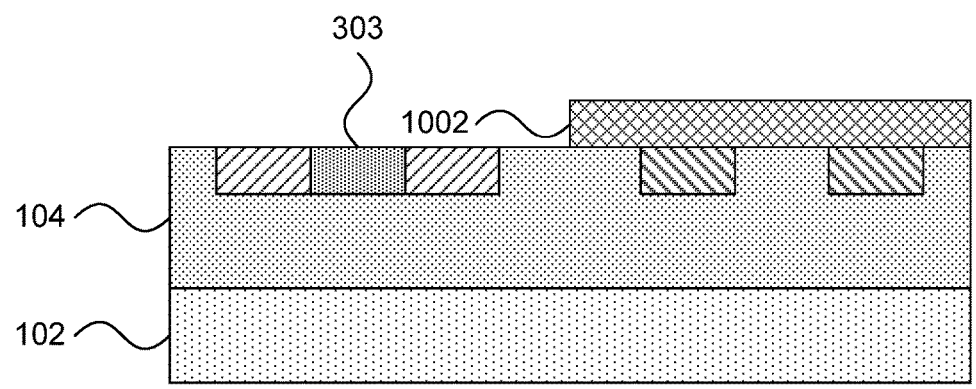
FIG. 11 is a cross-sectional diagram of an alternative step in forming a plurality of semiconductor devices in accordance with the present principles.

Referring now to FIG. 11, a step in fabricating an alternative embodiment of a set of field effect transistors is shown. The photoresist 1006 is stripped away and a wet etch is used to remove the top masking layer 904. In the present example, where the top masking layer 904 is formed from silicon dioxide, a dilute hydrofluoric acid wash may be used to remove the top masking layer 904, leaving the bottom masking layer 902 exposed.

Figure 12:
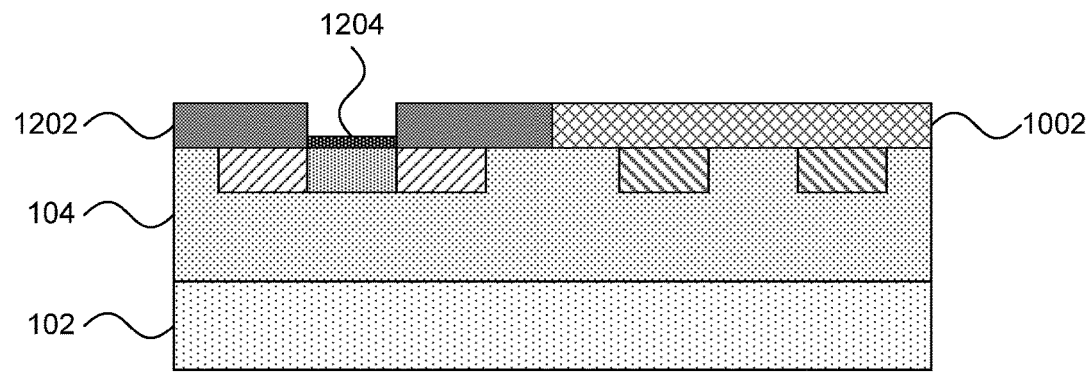
FIG. 12 is a cross-sectional diagram of an alternative step in forming a plurality of semiconductor devices in accordance with the present principles.

Referring now to FIG. 12, a step in fabricating an alternative embodiment of a set of field effect transistors is shown. A semiconductor cap 1204 is formed on a top surface of exposed channel 303. The semiconductor cap 1204 may be formed from any appropriate semiconductor material, with silicon being contemplated in particular, and may be deposited using any appropriate process such as, e.g., CVD, PVD, ALD, or GCIB. A mask 1202 is deposited over the device, with gaps over the exposed channel 303, to limit the deposition of the semiconductor cap 1204 to only the channel areas. The mask 1202 may be formed by any appropriate dielectric or insulator material, such as a hard-mask material or bulk dielectric. Materials for the mask 1202 may include, e.g., silicon dioxide or silicon nitride. The mask 1202 may be formed by any appropriate process including, e.g., forming a dummy gate, depositing a masking material, and then removing the dummy gate.

Figure 13:
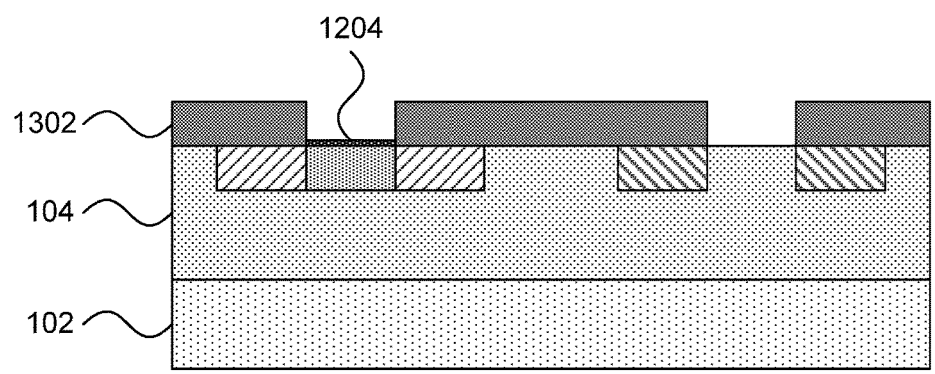
FIG. 13 is a cross-sectional diagram of an alternative step in forming a plurality of semiconductor devices in accordance with the present principles.

Referring now to FIG. 13, a step in fabricating an alternative embodiment of a set of field effect transistors is shown. The mask 1202 is extended over the source and drain regions 304 around the group IV semiconductor channel 306 to form mask 1302. The mask 1302 may be extended by any appropriate process including, e.g., blocking the existing mask 1202, forming a dummy gate, depositing dielectric, and removing the dummy gate and blocking structure.

In one embodiment, a layer of oxide material, for example an aluminum oxide, may optionally be deposited on the channels 303/306 and over the semiconductor cap 1204. Forming such a layer may improve the interface state density, in particular for III-V semiconductors. In addition, such a layer may be used to tune the threshold voltage of devices based on group IV semiconductors such as silicon or silicon germanium.

Figure 14:
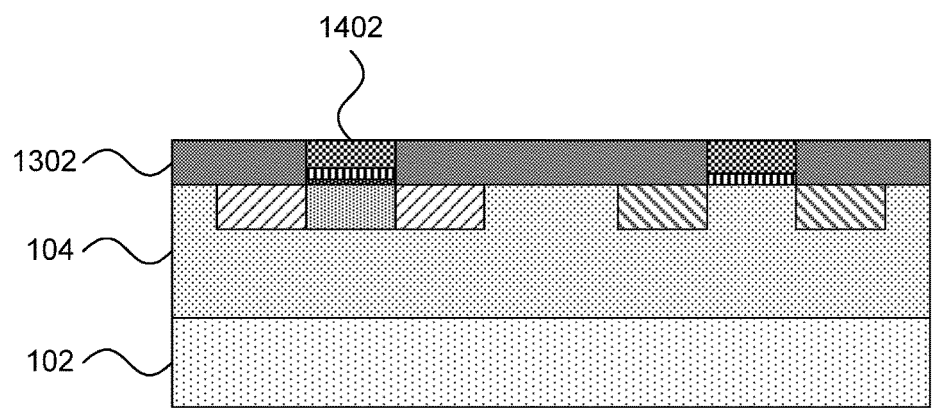
FIG. 14 is a cross-sectional diagram of an alternative step in forming a plurality of semiconductor devices in accordance with the present principles.

Referring now to FIG. 14, a step in fabricating an alternative embodiment of a set of field effect transistors is shown. A gate stack 1402 is formed over both channel regions 303/306. The gate stack includes a high-k dielectric layer and a gate material, as described in FIG. 6 above. Alternatively, the gate stacks may be formed with differing gate dielectrics and gate materials, as described in FIG. 7 above. It is specifically contemplated that hafnium oxide may be employed for the gate stack 1402, but any appropriate dielectric material may be used instead.

As an alternative to using an oxide layer underneath the high-k gate dielectric layer, an oxide layer may be deposited above the gate dielectric. In one particular embodiment, where hafnium oxide is used for the gate dielectric layer, aluminum oxide is used between the gate dielectric and the gate material in the gate stack 1402.

Figure 15:
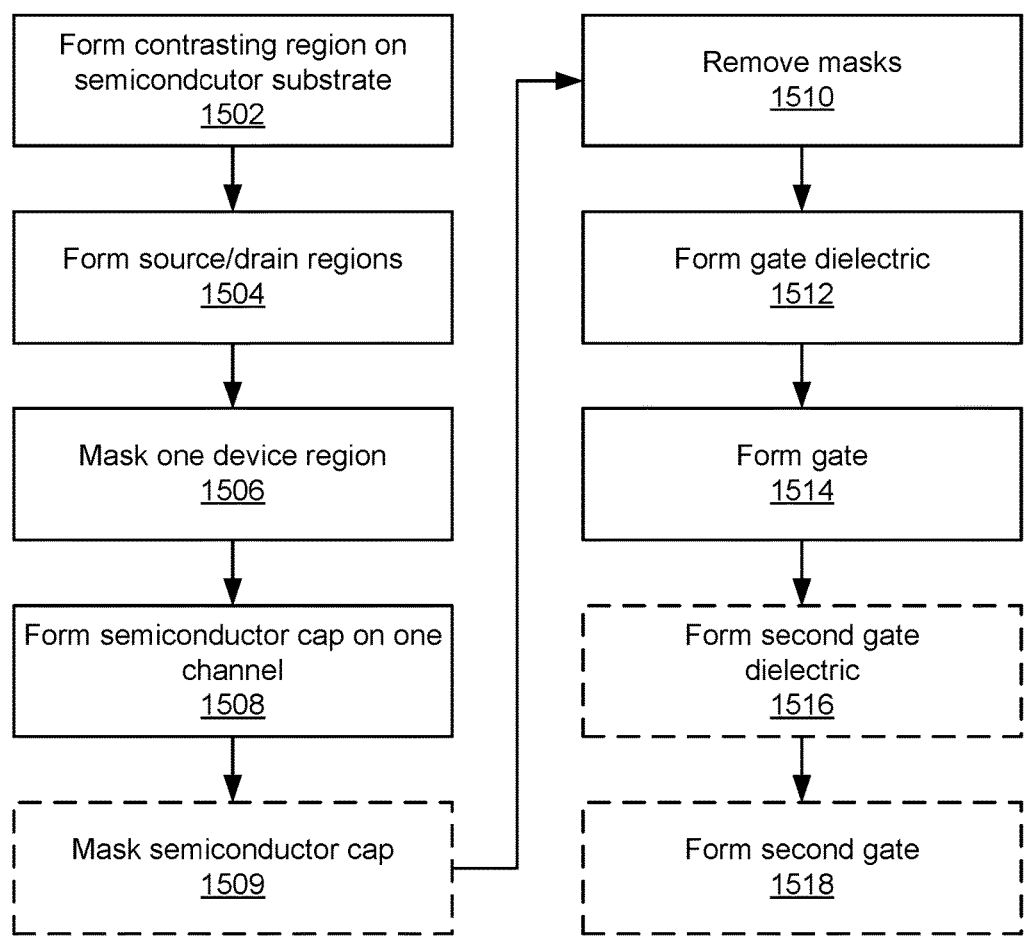
FIG. 15 is a block/flow diagram of an alternative method of forming a plurality of semiconductor devices in accordance with the present principles.

Referring now to FIG. 15, an alternative method of forming a set of field effect transistors is shown. Block 1502 forms the contrasting semiconductor region 202 on a semiconductor layer 104, with one of the two semiconductor materials being a group IV semiconductor and the other being a III-V semiconductor. Block 1504 forms source and drain regions 302 in the contrasting region 202, defining a contrasting semiconductor channel 303, as well as source and drain regions 304 in the semiconductor layer 104, defining the semiconductor channel 306.

Block 1506 masks one device region. The masked region may be either the group IV semiconductor layer 104 or the contrasting semiconductor region 202. The mask may be a mono-layer mask, a dual-layer mask, or any other appropriate masking configuration. Block 1508 then forms a silicon cap 1204 on the unmasked channel using any appropriate deposition process such as, e.g., CVD, PVD, ALD, or GCIB.

The masking process depicted above in FIGS. 9-12 is specifically drawn to a single-mask flow, but a two-mask flow is also possible. In the two-mask process, block 1509 forms a mask over the nitrogen-containing layer 1204, providing an opportunity to remove the remaining mask over the uncapped region. Block 1510 removes that mask and any other masks to expose the channel regions.

Block 1512 deposits a gate dielectric 502 over the channel regions and block 1514 forms a gate over the gate dielectric. In an optional embodiment, the gate dielectric and gate materials may be different in different devices, according to the design needs of the devices. In this case, blocks 1512 and 1514 form a first gate dielectric and first gate, while blocks 1516 and 1518 form a second gate dielectric and gate respectively.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a plurality of semiconductor devices, comprising:
   forming first source and drain regions by implanting a
      region of a continuous semiconductor substrate formed from a first group IV semiconductor material to define a first channel region in the continuous semiconductor substrate between the first source and drain regions;

forming a region of a second semiconductor material embedded in the continuous semiconductor substrate, comprising second source and drain regions and a second channel region between the second source and drain regions, the second channel region being formed from a group III-V semiconductor material that is different from a semiconductor material of the first channel region by forming a trench in the continuous semiconductor substrate and epitaxially growing the group III-V semiconductor material in the trench;

forming a mask on the continuous semiconductor substrate, wherein the mask has an opening aligned with each of the first channel region and the second channel region;

forming a silicon cap within the openings on each of the first channel region and the second channel region by gas cluster ion beam deposition;

forming a hafnium dioxide gate dielectric layer covering the silicon caps;

activating the hafnium dioxide gate dielectric layer using ozone;

forming a nitrogen-containing layer on the hafnium dioxide gate dielectric layer;

forming an aluminum oxide layer on the nitrogen-containing layer; and forming a gate metal on the aluminum oxide layer.

2. The method of claim 1, wherein the first channel region is coplanar with the second channel region.

3. The method of claim 1, wherein the openings in the mask layer are formed by etching.

4. The method of claim 1, further comprising etching away the mask layer after forming the gate.

5. The method of claim 1, wherein forming the nitrogen-containing layer comprises performing one process selected from the group consisting of an ammonia anneal and exposure to a nitrogen plasma.

6. A method for forming a plurality of semiconductor devices, comprising:

forming first source and drain regions by implanting a region of a continuous semiconductor substrate formed from a group IV semiconductor material to define a first channel region in the continuous semiconductor substrate between the first source and drain regions;

forming a region of second semiconductor material embedded in the continuous semiconductor substrate, comprising second source and drain regions and a second channel region between the second source and drain regions, wherein the second channel region is coplanar with the first channel region by forming a trench in the continuous semiconductor substrate and epitaxially growing a group III-V semiconductor material in the trench;

forming a mask on the continuous semiconductor substrate, wherein the mask has an opening aligned with each of the first channel region and the second channel region;

forming a silicon cap within the openings on each of the first channel region and the second channel region by gas cluster ion beam deposition;

forming a hafnium dioxide gate dielectric layer over the silicon caps;

activating the hafnium dioxide gate dielectric layer using ozone;

forming a nitrogen-containing layer on the hafnium dioxide gate dielectric layer;

forming an aluminum oxide layer on the nitrogen-containing layer; and forming a gate metal on the aluminum oxide layer.

7. The method of claim 6, wherein the openings in the mask layer are formed by etching.

8. The method of claim 7, further comprising etching away the mask layer after forming the gate.

9. The method of claim 6, wherein forming the nitrogen-containing layer comprises performing one process selected from the group consisting of an ammonia anneal and exposure to a nitrogen plasma.

10. A method for forming a plurality of semiconductor devices, comprising:

forming first source and drain regions by implanting a region of a continuous semiconductor substrate formed from a group IV semiconductor material to define a first channel region in the continuous semiconductor substrate between the first source and drain regions;

forming a region of second semiconductor material embedded in the continuous semiconductor substrate, comprising second source and drain regions and a second channel region between the second source and drain regions, wherein the second channel region is coplanar with the first channel region by forming a trench in the continuous semiconductor substrate and epitaxially growing a group III-V semiconductor material in the trench;

depositing a mask layer over the continuous semiconductor substrate with openings directly over the first and second channel regions;

forming a silicon cap on each of the first channel region and the second channel region within the openings of the mask layer by gas cluster ion beam deposition;

forming a hafnium dioxide gate dielectric layer over the silicon caps;

activating the hafnium dioxide gate dielectric layer using ozone;

forming a nitrogen-containing layer on the hafnium dioxide gate dielectric layer;

forming an aluminum oxide layer on the nitrogen containing layer;

forming a gate metal on the aluminum oxide layer; and etching away the mask layer after forming the gate metal.

* * * * *